(12) United States Patent
Watanabe (10) Patent No.: US 11,497,152 B2
(45) Date of Patent: Nov. 8, 2022

(54) ELECTROMAGNETIC WAVE SHIELD FILM, PRINTED WIRING BOARD USING SAME, AND ROLLED COPPER FOIL

(71) Applicant: Tatsuta Electric Wire & Cable Co., Ltd., Higashiosaka (JP)

(72) Inventor: Masahiro Watanabe, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 89 days.

(21) Appl. No.: 16/929,736

(22) Filed: Jul. 15, 2020

(65) Prior Publication Data

US 2020/0352062 A1 Nov. 5, 2020

Related U.S. Application Data (60) Division of application No. 16/235,116, filed on Dec. 28, 2018, now Pat. No. 10,757,849, which is a continuation of application No. 14/894,508, filed as application No. PCT/JP2014/061989 on Apr. 30, 2014, now abandoned.

(30) Foreign Application Priority Data

May 29, 2013 (JP) ................... 2013-113194

(51) Int. Cl.
H05K 9/00 (2006.01)
H05K 1/02 (2006.01)
H05K 1/03 (2006.01)

(52) U.S. Cl.
CPC ......... H05K 9/0084 (2013.01); H05K 1/0216 (2013.01); H05K 9/0081 (2013.01); H05K 1/0393 (2013.01); H05K 2201/0358 (2013.01); H05K 2203/1178 (2013.01)

(58) Field of Classification Search
CPC ... H05K 9/0081; H05K 9/0003; H05K 9/0084
See application file for complete search history.

(56) References Cited

U.S. PATENT DOCUMENTS

| 2002/0050783 | A1 | 5/2002 | Kubota et al. |
| 2005/0048306 | A1* | 3/2005 | Suzuki ............... H05K 3/025 |
| | | | 428/548 |
| 2008/0107865 | A1 | 5/2008 | Matsunaga et al. |
| 2008/0200333 | A1 | 8/2008 | Gotou et al. |
| 2009/0008142 | A1 | 1/2009 | Shimizu et al. |
| 2009/0095511 | A1 | 4/2009 | Iida et al. |
| 2009/0126984 | A1 | 5/2009 | Saneto et al. |
| 2012/0068265 | A1 | 3/2012 | Maki et al. |
| 2012/0152599 | A1 | 6/2012 | Kitagawa et al. |
| 2015/0201535 | A1* | 7/2015 | Su ................... H05K 9/0084 |
| | | | 174/388 |

FOREIGN PATENT DOCUMENTS

| CN | 101014460 | B | | 6/2011 |
| CN | 102484951 | A | | 5/2012 |
| CN | 103108533 | A | | 5/2013 |
| JP | H0818228 | A | | 1/1996 |
| JP | H08175891 | A | | 7/1996 |
| JP | 2004095566 | A | | 3/2004 |
| JP | 2004122456 | A | | 4/2004 |
| JP | 2005260058 | A | * | 9/2005 |
| JP | 2005260058 | A | | 9/2005 |
| JP | 2008041553 | A | | 2/2008 |
| JP | 2009099624 | A | | 5/2009 |
| JP | 2010239141 | A | | 10/2010 |
| JP | 2013084975 | A | | 5/2013 |
| KR | 20090114163 | A | | 11/2009 |
| TW | 456164 | B | | 9/2001 |
| TW | 200526819 | A | | 8/2005 |
| TW | M428656 | U | | 5/2012 |

OTHER PUBLICATIONS

A machine translation into Englsh of JP 2005-260058 A1; Suzuki et al; Sep. 2005 (Year: 2005).*
International Search Report, PCT/JP2014/061989, dated Aug. 5, 2014.
References Are Not Being Filed Herewith. They Are Already of Record in One or More of the Following Applications, Which Are Being Relied on for Priority Under 35 U.S.C. Section 120 (see 37 C.F.R. Section 1.98(d)(1)): U.S. Appl. No. 16/235,116, filed Dec. 28, 2018 and U.S. Appl. No. 16/235,116, filed Dec. 28, 2018.

\* cited by examiner

*Primary Examiner* — Karuna P Reddy
(74) *Attorney, Agent, or Firm* — United IP Counselors, LLC; Kenneth Fagin (57) ABSTRACT

An electromagnetic wave shield film in which peeling off between a metal thin film and an adhesive layer is prevented and a printed wiring board employing the electromagnetic wave shield are provided. An electromagnetic wave shield film is formed by laminating at least a metal thin film and an adhesive layer in order, and the water vapor permeability of the electromagnetic wave shield film according to JISK7129 is 0.5 $g/m^2$ per 24 hours or higher at a temperature of 80 degrees centigrade, a moisture of 95% RH, and a pressure difference of 1 atm.

2 Claims, 6 Drawing Sheets

EXAMPLE 1

BEFORE ETCHING   AFTER ETCHING

FIG.7B

EXAMPLE 2

BEFORE ETCHING   AFTER ETCHING

ELECTROMAGNETIC WAVE SHIELD FILM, PRINTED WIRING BOARD USING SAME, AND ROLLED COPPER FOIL

CROSS REFERENCE TO RELATED APPLICATIONS

This application is a divisional of U.S. application Ser. No. 16/235,116 filed Dec. 28, 2018, the priority benefit of which is claimed and the contents of which are incorporated by reference. That application is a continuation of and claims the priority benefit of U.S. application Ser. No. 14/894,508, which has a 371(c) date of Nov. 28, 2015 and the contents of which are incorporated herein by reference. That application is the U.S. National Stage of Int. Pat. App. No. PCT/JP2014/061989, filed Apr. 30, 2014, which application claims priority to JP 2013-113194, filed May 29, 2013, both of which applications are incorporated herein by reference in their entireties.

TECHNICAL FIELD

The present invention relates to an electromagnetic wave shield film, a shield printed wiring board using the shield film, and a rolled copper foil which is usable for an electromagnetic wave shield film.

BACKGROUND

An electromagnetic wave from the outside is typically shielded, for example, by pasting an electromagnetic wave shield film (printed wiring board shield film) onto a printed wiring board such as a flexible printed wiring board (FPC).

For example, an electromagnetic wave shield film recited in PTL 1 is configured in such a way that an adhesive layer, a metal thin film, and an insulating layer are laminated in order. As this electromagnetic wave shield film is superposed onto a flexible printed wiring board and thermal pressing is performed, the electromagnetic wave shield film is joined with the printed wiring board by the adhesive layer and the shield printed wiring board is manufactured. After above joining, components are mounted on the printed wiring board by solder reflow. In addition to the above, in the flexible printed wiring board, a print pattern on the base film is covered with an insulating film.

CITATION LIST

Patent Literature

[PTL 1] Japanese Unexamined Patent Publication No. 2004-095566

SUMMARY OF INVENTION

Technical Problem

When the shield printed wiring board recited in PTL 1 is heated in a thermal pressing process or a solder reflow process, gas is generated from the adhesive layer of the electromagnetic wave shield film, the insulating film of the printed wiring board, or the like. Furthermore, when the base film of the printed wiring board is made of highly hygroscopic resin such as polyimide, water vapor may be generated from the base film due to the heating. Such volatile components generated from the adhesive layer, the insulating film, and the base film cannot pass the metal thin film, and hence the volatile components are accumulated between the metal thin film and the adhesive layer. On this account, when rapid heating is performed in the solder reflow process, the interlayer adhesion between the metal thin film and the adhesive layer may be broken by the volatile components accumulating between the metal thin film and the adhesive layer. To prevent this problem, the shield printed wiring board is typically annealed before the solder reflow process to volatilize the volatile components in advance. However, because the annealing requires hours to process, the production time is elongated.

The present invention was made to solve the problem above, and an object of the present invention is to provide an electromagnetic wave shield film which prevents a metal thin film and an adhesive layer from being peeled off from each other and to provide a shield printed wiring board using the electromagnetic wave shield film.

According to the first aspect of the invention, an electromagnetic wave shield film includes at least a metal thin film and an adhesive layer which are laminated in order, wherein, water vapor permeability according to JISK7129 is 0.5 g/m$^2$ per 24 hours or higher at a temperature of 80 degrees centigrade, a moisture of 95% RH, and a differential pressure of 1 atm.

According to the configuration above, because the water vapor permeability according to JISK7129 is 0.5 g/m$^2$ per 24 hours or higher at a temperature of 80 degrees centigrade, a moisture of 95% RH, and a differential pressure of 1 atm, even if volatile components are generated from the adhesive, the resin film of the printed wiring board, or the like when the electromagnetic wave shield film of the present invention which is adhered to the printed wiring board by the adhesive is heated, the volatile components are allowed to escape to the outside, and hence delamination due to the accumulation of the volatile components between the metal thin film and the adhesive layer is prevented.

According to the second aspect of the invention, the electromagnetic wave shield film of the first aspect is configured such that the metal thin film is formed by immersing, in a solvent, a metal sheet formed of a hard-to-dissolve component with low solubility in the solvent and an easily-dissolved component more soluble in the solvent than the hard-to-dissolve component, the easily-dissolved component is particles of a granular material, and the particles are dispersed in the metal sheet. As the granular material is dissolved in the solvent, openings are formed in the metal thin film.

According to the configuration above, as the metal sheet formed of the hard-to-dissolve component and the easily-dissolved component is immersed in the solvent, the granular material made of the easily-dissolved component dissolves and disappears as it is more easily dissolved in the solvent than the hard-to-dissolve component. Therefore, the openings may be formed in the metal thin film. In addition to the above, because the granular material is dispersed over the entire metal sheet, the metal thin film with multiple openings all over is obtained. On this account, when the electromagnetic wave shield film of the present invention adhered to the printed wiring board by the adhesive is heated, even if volatile components are generated from the adhesive, the resin film of the printed wiring board or the like, the volatile components are allowed to escape to the outside via the openings of the metal thin film, and hence delamination due to the volatile components accumulating between the metal thin film and the adhesive layer is prevented.

The electromagnetic wave shield film of the third aspect of the invention is configured such that, in the second aspect, the hard-to-dissolve component is metal mainly made of copper, whereas the easily-dissolved component is copper oxide.

According to the configuration above, the electromagnetic wave shield film of the present invention is efficiently produced by using an etching solution which has been commonly used as a solvent. Examples of the commonly-used etching solution include a sodium persulfate aqueous solution, a mixed solution of hydrogen peroxide and sulfuric acid, an iron chloride aqueous solution, and a copper chloride aqueous solution.

The electromagnetic wave shield film of the fourth aspect of the invention is configured such that, in the second aspect, the hard-to-dissolve component is metal mainly made of copper, whereas the easily-dissolved component is copper oxide (I).

According to the configuration above, the electromagnetic wave shield film of the present invention is further efficiently produced by using an etching solution which has been commonly used as a solvent.

The electromagnetic wave shield film of the fifth aspect of the invention is configured such that, in any one of the second to fourth aspects, each of the openings ranges from 0.1 to 100 µm in diameter.

According to this configuration, because each opening is 0.1 µm or longer in diameter, even if volatile components are generated from the adhesive, the resin film of the printed wiring board, or the like when the electromagnetic wave shield film of the present invention adhered to the printed wiring board by the adhesive is heated, the volatile components are allowed to escape to the outside through the openings of the metal thin film, and hence the accumulation of the volatile components from the adhesive or the like between the metal thin film and the adhesive layer is prevented. In addition to the above, because each opening is 100 µm or shorter in diameter, good electromagnetic wave shielding characteristics are exhibited to low frequency electromagnetic waves, and the metal thin film is less likely to be broken and is easily handled.

In order to satisfy both of the handling and the electromagnetic wave shielding characteristics, each opening is preferably 50 µm or shorter in diameter, and more preferably 10 µm or shorter in diameter.

The electromagnetic wave shield film of the sixth aspect of the invention is configured such that, in any one of the second to fifth aspects, the number of the openings per 1 $cm^2$ in the metal thin film is 10 to 1000/$cm^2$.

According to the configuration above, because the number of the openings is 10/$cm^2$ or more, even if volatile components are generated from the adhesive, the resin film of the printed wiring board, or the like when the electromagnetic wave shield film of the present invention adhered to the printed wiring board by the adhesive is heated, the volatile components are allowed to escape to the outside through the openings of the metal thin film, and hence the accumulation of the volatile components from the adhesive or the like between the metal thin film and the adhesive layer is further certainly prevented.

In addition to the above, because the number of the openings is 1000/$cm^2$ or less, the metal thin film is less likely to be broken and is easily handled.

The electromagnetic wave shield film of the seventh aspect of the invention is configured such that, in any one of the second to sixth aspects, the metal thin film is in a range of 0.5 to 12 µm in thickness.

According to the configuration above, because the thickness of the metal thin film is 0.5 µm or thicker, the metal thin film is less likely to be broken and is easily handled, and good electromagnetic wave shielding characteristics are achieved.

In addition to the above, because the thickness of the metal thin film is 12 µm or thinner, the electromagnetic wave shield film shows good flexibility.

The electromagnetic wave shield film of the eighth aspect of the invention is configured such that, in any one of the first to seventh aspects, the metal thin film is a rolled copper foil.

According to the configuration above, when the rolled copper foil is used as the metal thin film of the electromagnetic wave shield film, good electromagnetic wave shielding characteristics are achieved. Furthermore, because the rolled copper foil is an inexpensive material, a metal thin film suitable for the electromagnetic wave shield film is obtained. In addition to the above, preferably, the rolled copper foil is formed of tough-pitch copper made of copper oxide (I) and pure copper which is 99.9% or higher in purity, in which the copper oxide is equivalent to the easily-dissolved component and the pure copper is equivalent to the hard-to-dissolve component. This is because a metal thin film having plural openings is easily obtained by using a commonly-used etching solution. An example of the rolled copper foil other than the tough-pitch copper is a copper foil including copper oxide such as an HA foil (made by JX Nippon Mining & Metals Corp.). In addition to the above, because a copper foil with desired thickness is obtained by etching the rolled copper foil, the thickness of the metal thin film is highly precisely adjusted and the metal thin film can be suitably used for the electromagnetic wave shield film.

A rolled copper foil of the ninth aspect of the present invention is a rolled copper foil in which openings are formed by wet etching, wherein, each of the openings is in a range of 0.1 to 100 µm in diameter, the number of the openings per 1 $cm^2$ in the rolled copper foil is in a range of 10 to 1000/$cm^2$, and the rolled copper foil is in a range of 0.5 to 12 µm in thickness.

According to the configuration above, a metal thin film suitable for an electromagnetic wave shield film is obtained by conventional wet etching and by using an inexpensive and widely-available rolled copper foil. In addition to the above, because each opening is in a range of 0.1 to 100 µm in diameter, the number of the openings is 10 to 1000/$cm^2$ per 1 $cm^2$ in the rolled copper foil, and the thickness of the rolled copper foil is in a range of 0.5 to 12 µm, when the electromagnetic wave shield film of the present invention adhered to the printed wiring board by the adhesive is heated, even if volatile components are generated from the adhesive, the resin film of the printed wiring board or the like, the volatile components are allowed to escape to the outside via the openings of the metal thin film, and hence delamination due to the volatile components accumulating between the metal thin film and the adhesive layer is prevented, and an electromagnetic wave shield film showing good shielding characteristics is provided.

The wet etching in the present invention may be a known method. Examples of the known wet etching include elution of metal by electrolysis in an electrolysis solution and elution of metal by oxidizing the metal in a solvent.

A shield printed wiring board of the tenth aspect of the invention is configured to include the electromagnetic wave shield film of any one of the first to eighth aspects.

According to the configuration above, failures due to the generation of volatile components in the manufacturing process are sufficiently reduced, and a shield printed wiring board showing excellent electromagnetic wave shielding characteristics is obtained.

Advantageous Effect of Invention

In the electromagnetic wave shield film of the present invention, delamination of the metal thin film and the adhesive layer due to the volatile components generated from the adhesive or the like is prevented.

DESCRIPTION OF EMBODIMENTS

First Embodiment

Figure 1:
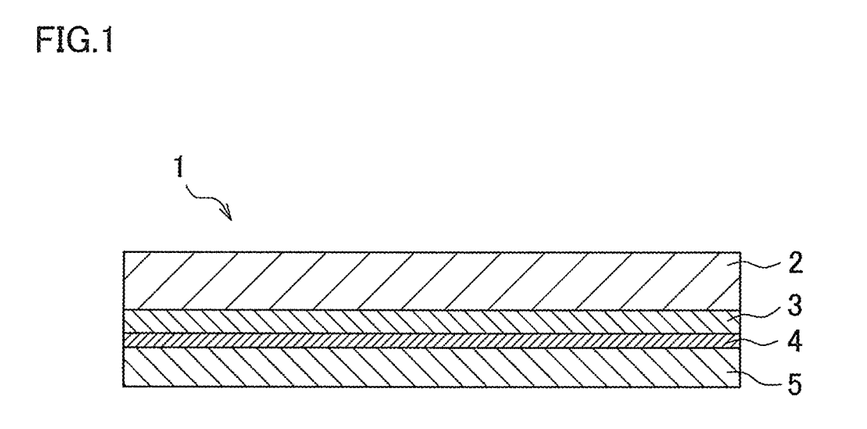
FIG. 1 is a cross section of an electromagnetic wave shield film of First Embodiment.

The following will describe an embodiment of the present invention. As shown in FIG. 1, an electromagnetic wave shield film 1 of the present embodiment (hereinafter, a shield film 1) is formed by laminating a transfer film 2, an insulating layer 3, a metal thin film 4, and an adhesive layer 5 in order.

Figure 2:
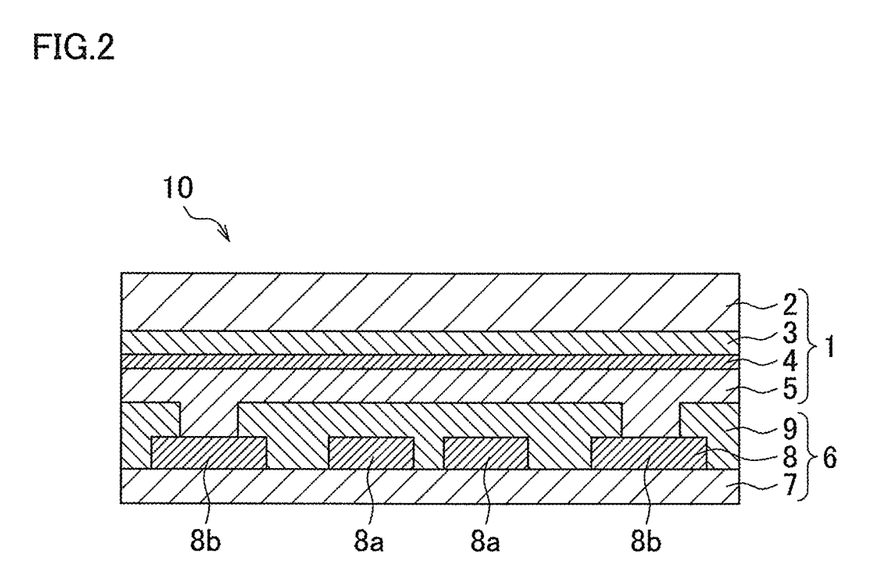
FIG. 2 is a cross section of a shield printed wiring board including the electromagnetic wave shield film of FIG. 1.

The shield film 1 is used by being pasted onto, for example, a flexible printed wiring board (FPC) 6 shown in FIG. 2 or a printed wiring board such as a COF (Chip On Flex), an RF (flex print board), a multilayer flexible substrate, and a rigid substrate. The shield film 1 and the flexible printed wiring board 6 constitute a shield printed wiring board 10.

The transfer film 2 is provided for purposes such as the protection of the insulating layer 3 or the like when the shield film 1 is mounted on the flexible printed wiring board 6 and thermal pressing is performed, and for purposes such as the improvement in handling of the shield film 1 by improving the rigidity to the shield film 1. The transfer film 2 is, for example, made of polyethylene terephthalate (PET), polypropylene, cross-linked polyethylene, polybenzimidazole, aramid, polyimide, polyimidoamide, polyetherimide, polyphenylene sulfide (PPS), polyethylene naphthalate (PEN), or like. When heat resistance is not required so much, a polyethylene terephthalate film is preferred for its inexpensiveness. When fire retardance is required, a polyphenylene sulfide film is preferred. When heat resistance is additionally required, an aramid film or a polyimide film is preferred. The transfer film 2 may not be provided.

The insulating layer 3 is provided to insulate the metal thin film 4 so as to prevent short-circuiting of the metal thin film 4 with surrounding circuits. The insulating layer 3 is formed of a cover film or a coating layer made of insulating resin. According to need, the insulating layer 3 may include a curing accelerator, a tackifier, an antioxidant, a pigment, a dye, a plasticizer, an ultraviolet absorber, an antifoaming agent, a leveling agent, filler, a flame retardant, a viscosity control agent, an antiblocking agent, or the like. The insulating layer 3 may be formed by two or more types of layers which are different from one another in composition.

The insulating resin of which the cover film is made is engineering plastics. Examples of the engineering plastics include polypropylene, cross-linked polyethylene, polyester, polybenzimidazole, polyimide, polyimidoamide, polyetherimide, polyphenylene sulfide (PPS), and polyethylene naphthalate (PEN). The cover film is joined with the metal thin film 4 by using, for example, an adhesive.

Examples of the insulating resin of which the coating layer is formed include thermoplastic resin, thermosetting resin, ultraviolet-curing resin and electron-beam-curing resin. Examples of the thermoplastic resin include styrene-based resin, vinyl acetate-based resin, polyester-based resin, polyethylene-based resin, polypropylene-based resin, imide-based resin, and acryl-based resin. Examples of the thermosetting resin include phenol resin, acrylic resin, epoxy resin, melamine resin, silicon resin, and acryl-modified silicon resin. Examples of the ultraviolet-curing resin include epoxy acrylate resin, polyester acrylate resin, and methacrylate modifications thereof. The coating layer is, for example, formed to be closely in contact with the metal thin film as the resin is applied to the surface of the metal thin film and dried.

The metal thin film 4 has a shielding effect of shielding an electromagnetic wave from the outside and noise such as unnecessary radiation of an electric signal from the printed wiring board 6. The metal thin film 4 is made of copper or copper alloy. An example of the copper alloy is an alloy which is mainly made of copper and includes any one of silver, nickel, tin, gold, platinum, palladium, aluminum, chromium, titanium, and zinc, or at least two of them. Because the metal thin film 4 is formed of copper or alloy which is mainly made of copper, good electromagnetic wave shielding characteristics and good economic efficiency are achieved. The thickness of the metal thin film 4 is in a range of 0.5 to 12 μm, and is preferably in a range of 2 to 3 μm.

Figure 3A:
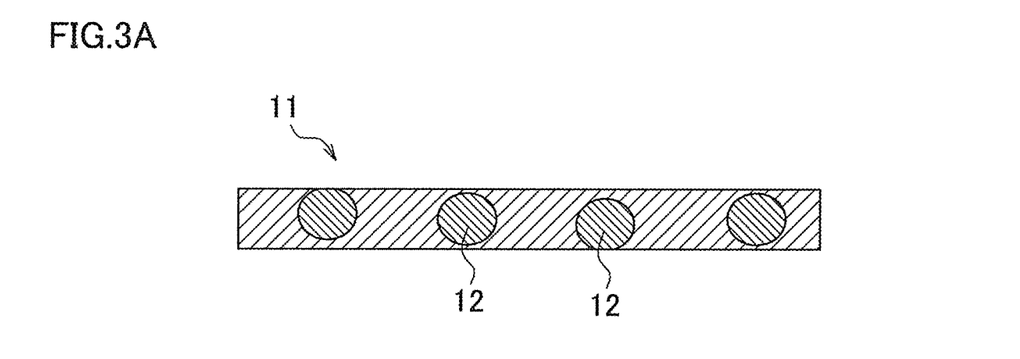
FIG. 3A is an end view for explaining a process of manufacturing a metal thin film of the electromagnetic wave shield film of FIG. 1.
Figure 3B:
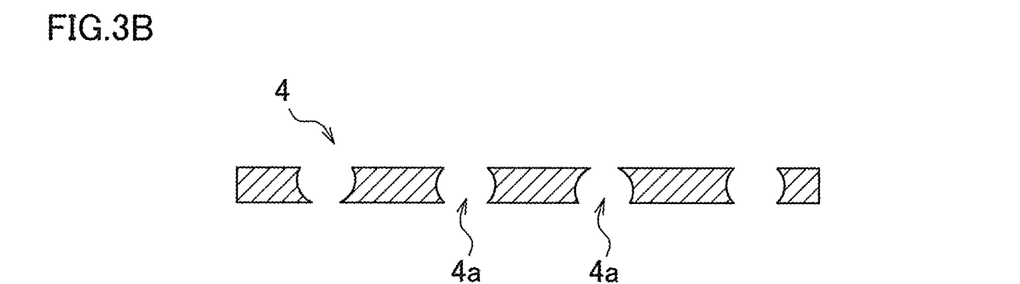
FIG. 3B is an end view for explaining a process of manufacturing a metal thin film of the electromagnetic wave shield film of FIG. 1.

In addition to the above, as shown in FIG. 3B, in the metal thin film 4, plural pin holes (openings) 4a are formed. Each pin hole 4a is about 0.1 to 100 μm in diameter. The diameter of the pin hole 4a is preferably 50 μm or shorter and more preferably 10 μm or shorter. The density of the pin holes 4a is in a range of 10 to 1000 holes/cm².

The metal thin film 4 of the present embodiment is formed by immersing, in an etching solution, a rolled copper foil 11 which is formed by copper or copper alloy rolled by rollers or the like. As shown in FIG. 3A, the rolled copper foil 11 includes granular copper oxide 12. The copper oxide 12 is 0.1 to 100 μm in grain diameter and is dispersed over the entire rolled copper foil 11. The thickness of the rolled copper foil 11 before the etching is in a range of 1.0 to 100 μm, and is preferably in a range of about 10 to 40 μm when the thickness after the etching is in a range of 2 to 3 μm.

The rolled copper foil 11 is preferably a rolled copper foil formed by rolling tough-pitch copper or an HA foil (product name) which is formed by rolling alloy of copper and silver and is made by JX Nippon Mining & Metals Corp. The rolled copper foil made of the tough-pitch copper is particularly preferable on account of a large content of the copper oxide. The tough-pitch copper is copper which includes copper oxide (I) and pure copper occupies at least 99.9% of the tough-pitch copper. The HA foil also includes the copper oxide (I). Examples of the etching solution include an etching-solution sodium persulfate aqueous solution, a mixture liquid of hydrogen peroxide and sulfuric acid, an iron chloride aqueous solution, and a copper chloride aqueous solution.

The copper oxide 12 is highly soluble in the above-described etching solution as compared to a part of the rolled copper foil 11 excluding the copper oxide 12 (i.e., pure copper or copper alloy). On this account, when the rolled copper foil 11 is immerse in the etching solution, as shown in FIG. 3B, the rolled copper foil 11 becomes thinner as the copper oxide 12 is dissolved and disappear so that the pin holes 4a substantially identical in size with the gram diameter of the copper oxide 12 may be formed in the rolled copper foil 11. Because the copper oxide 12 is dispersed over the entire rolled copper foil 11, the plural pin holes 4a are formed in the entire rolled copper foil 11. As such, the pin holes are formed in the metal thin film 4 in such a way that the copper oxide 12 is preferentially dissolved by the etching solution so that the pin holes 4a are formed in the entire rolled copper foil 11.

The adhesive layer 5 is provided to make the shield film 1 adhere to the printed wiring board 6. The adhesive resin from which the adhesive layer 5 is formed is thermoplastic resin, thermosetting resin, ultraviolet-curing resin, or electron-beam-curing resin. The adhesive layer 5 is, for example, formed to be closely in contact with the metal thin film 4 in such a way that resin is applied to the surface of the metal thin film 4 and cured.

Examples of the thermoplastic resin of which the adhesive layer 5 is formed include polystyrene-based resin, vinyl acetate-based resin, polyester-based resin, polyethylene-based resin, polypropylene-based resin, polyamide-based resin, rubber-based resin, and acryl-based resin. Examples of the thermosetting resin of which the adhesive layer 5 is formed include phenol-based resin, epoxy-based resin, urethane-based resin, melamine-based resin, and alkyd-based resin. The resin from which the adhesive layer 5 is formed may be entirely a single type of the resin above or may be a mixture of plural types of the resins above.

Examples of a layer-forming component of the ultraviolet-curing resin from which the adhesive layer 5 is formed include cationic polymers and radical polymers. Examples of the cationic polymers include epoxy-based polymer, vinyl ether-based polymer, and oxetane-based polymer. Examples of the radical polymers include polyester acrylate-based polymer, polyether acrylate-based polymer, acrylic oligomer acrylate-based polymer, urethane acrylate-based polymer, and epoxy acrylate-based polymer. An example of special radical polymerization with thiyl radicals is a combination formed by polyene with aryl group and polythiol with thiol group. In particular, in the present embodiment, cationic polymer which is a combination of solvent-soluble polyester resin, epoxy resin, cationic polymerization catalyst, and modified epoxy resin is preferably used, but the disclosure is not limited to this. The epoxy resin used in the cationic polymer may be a diglycidyl-type such as bisphenol A, F, and AF with an epoxy equivalent of 10000 or lower. Representative examples of the modified epoxy resin are glycidylated polyester resin and glycidylated butadiene.

The ultraviolet-curing resin is preferably successively-polymerized polymer. Furthermore, this successively-polymerized polymer is preferably ultraviolet-curing cationic polymer. The successively-polymerized polymer is cured even if irradiated with ultraviolet light for a short time, as the reaction successively progresses once the reaction starts. On this account, the adhesive layer 5 may be cured under the radiation of ultraviolet right for a short time. After the curing, the adhesive layer 5 excels in heat resistance. To accelerate the reaction speed, the cationic polymer may coexist with radical polymer.

Another layer-forming component of the ultraviolet-curing resin is rubber, polyfunctional acrylate, or the like. Examples of the rubber include styrene-butadiene-based block, random copolymer, acrylic rubber, polyisoprene, polybutadiene, butadiene-acrylnitrile rubber, polychloroprene, ethylene-vinyl acetate copolymer. An example of the polyfunctional acrylate is trimethylolpropane acrylate.

The layer-forming component of the electron-beam-curing resin from which the adhesive layer 5 is formed is mainly made of, for example, unsaturated polyester type, epoxy acrylate type, urethane acrylate type, polyester acrylate type, polyether acrylate type, and acryl type. Typically, a material which does not include an initiator in the composition of the ultraviolet-curing resin may be used. An example of such a material is a compound composition made up of epoxy acrylate, polyester acrylate, GPTA (Glyceryl Propoxy Triacrylate), and TRPGDA (Tripropylene Glycol Diacrylate).

The ultraviolet-curing resin includes a polymerization initiator for initiating the polymerization. Examples of a radical-polymer-type polymerization initiator include hydrogen abstraction types (e.g., benzophenone and thioxanthones), types with which radicals are formed by cleavage (e.g., benzoin ethers and acetophenones), and electron transfer types (e.g., a combination of aromatic ketone and tertiary amine). Examples of a cationic-polymer-type polymerization initiator include onium salts such as aromatic diazonium, aromatic halonium, and aromatic sulfonium. An example of an addition-polymer-type polymerization initiator is benzophenone.

In addition to the above, powder plated with silver, aluminum or gold, glass beads, or resin balls (with good optical properties, such as acrylic resin) may be mixed into ultraviolet-curing resin or electron-beam-curing resin. With this, ultraviolet light having entered a part of the ultraviolet-curing resin or the electron-beam-curing resin is irregularly reflected to spread across the ultraviolet-curing resin or the electron-beam-curing resin, with the result that the curing is further promoted.

In addition to the above, the adhesive layer 5 may further include a tackifier. Examples of the tackifier include fatty acid hydrocarbon resin, C5/C9 mixed resin, rosin, rosin derivative, terpene resin, aromatic hydrocarbon resin, and thermal reactive resin.

The adhesive layer 5 is preferably a conductive adhesive layer in which conductive fillers are included in the adhesive resin described above. The conductive fillers are entirely or partially formed of a metal material. For example, the conductive fillers may be made of conductive fibers, carbon, silver, copper, nickel, solder, aluminum, silver-coated copper powder, gold-coated copper powder, silver-coated nickel powder, or gold-coated nickel powder. Such metal powders may be formed by atomization, carbonylation, or the like. As the conductive fillers, particles formed by metal-plated resin balls, glass beads or the like, or particles formed by coating metal powder with resin may be used. Furthermore, the conductive fillers may be a mixture of two or more types of the above-described metal powders and particles. The conductive fillers are preferably silver-coated copper powder or silver-coated nickel powder. This is because conductive particles with stable conductivity may be obtained from inexpensive materials.

Preferably, the conductive fillers are made of metal which is formed of at least two components, forms alloy when melted, and is low-melting-point metal in which the remelting temperature of the alloy is higher than the initial melting point. On account of the low melting point of the conductive fillers, the conductive fillers are melted and joined at a temperature which is sufficiently low to prevent components or the like of the printed wiring board 6 from being damaged, when the shield film 1 is joined with the printed wiring board 6 by thermal pressing. Furthermore, when the conductive fillers are cooled and solidified after the melting, the conductive fillers become alloy and the remelting point of the conductive fillers becomes higher than the initial melting point. For this reason, the conductive fillers which have been heated and solidified are less likely to be melted again, even if the shield film 1 is exposed to a high-temperature environment.

Although depending on the shape of the fillers or the like, the ratio of the conductive fillers to the adhesive resin is preferably 10 to 400 parts by weight relative to 100 parts by weight of the adhesive resin in case of silver-coated copper fillers, and is more preferably 20 to 150 parts by weight relative to 100 parts by weight of the adhesive resin. When the ratio of the conductive fillers exceeds 400 parts by weight, the adhesiveness to a later-described ground circuit 8b is deteriorated and the flexibility of the shield printed wiring board 10 becomes deteriorated. In the meanwhile, the conductivity is significantly deteriorated when the ratio of the conductive fillers is lower than 10 parts by weight. In cases of nickel fillers, the ratio of the conductive fillers to the adhesive resin is preferably 40 to 400 parts by weight relative to 100 parts by weight of the adhesive resin, and is more preferably 100 to 350 parts by weight relative to 100 parts by weight of the adhesive resin. When the ratio of the conductive fillers exceeds 400 parts by weight, the adhesiveness to the later-described ground circuit 8b is deteriorated and the flexibility of the shield FPC or the like become deteriorated. In the meanwhile, the conductivity is significantly deteriorated when the ratio of the conductive fillers is lower than 40 parts by weight. The shape of the metal filler may be any one of spherical, needle-shaped, fiber-shaped, flake-shaped, or resin-shaped.

In addition to the above, the conductive adhesive layer may be an anisotropic conductive adhesive layer. The anisotropic conductive adhesive layer is an adhesive layer which has different conductivities in thickness directions and in surface directions. With this, better transmission characteristics are achieved than those of an isotropic conductive adhesive layer which an electrically conductive state is achieved in all directions in three dimensions constituted by thickness direction, width direction, and longitudinal direction. The anisotropic conductive adhesive layer 5 is formed in such a way that a flame retardant and the above-described conductive fillers are added to an adhesive. When the shield film 1 is employed in an FPC (flexible printed wiring board), the minimum thickness of the anisotropic conductive adhesive layer 5 is preferably 2 μm, and more preferably 3 μm. The maximum thickness of the anisotropic conductive adhesive layer 5 is preferably 15 μm, and more preferably 9 μm. As adhesive resin, the adhesive included in the anisotropic conductive adhesive layer 5 is formed of thermoplastic resin such as polystyrene-based resin, vinyl acetate-based resin, polyester-based resin, polyethylene-based resin, polypropylene-based resin, polyamide-based resin, rubber-based resin, and acryl-based resin, or thermosetting resin such as phenol-based resin, epoxy-based resin, urethane-based resin, melamine-based resin, and alkyd-based resin. The adhesive may be entirely a single type of the resin above or may be a mixture of plural types of the resins above. The amount of the added conductive fillers is in a range of 3 weight % to 39 weight % relative to the total amount of the anisotropic conductive adhesive layer 5. The average particle diameter of the conductive fillers preferably falls within the range of 2 μm to 20 μm, but an optimum value may be chosen in accordance with the thickness of the anisotropic conductive adhesive layer 5.

The water vapor permeability of the shield film 1 according to JISK7129 is 0.5 $g/m^2$ per 24 hours or higher at a temperature of 80 degrees centigrade, a moisture of 95% RH, and a differential pressure of 1 atm.

The shield film 1 is, for example, manufactured in such a way that, after the metal thin film 4 is formed by etching the rolled copper foil 11 as described above, the insulating layer 3 is formed on one surface of the metal thin film 4 and then the transfer film 2 is formed further thereon. Furthermore, the adhesive layer 5 is formed on the other surface of the metal thin film 4.

Now, the flexible printed wiring board 6 to which the shield film 1 is pasted will be described. As shown in FIG. 2, the flexible printed wiring board 6 is formed by laminating a base film 7, a printed circuit 8, and an insulating film 9 in order.

The printed circuit 8 is formed of a signal circuit 8a and a ground circuit 8b. The ground circuit 8b is covered by the insulating film 9 except at least a part of the ground circuit 8b. On this account, when the adhesive layer 5 of the shield film 1 is formed of conductive adhesive, the ground circuit 8b and the metal thin film 4 are electrically connected with each other via the adhesive layer 5, with the result that the electromagnetic wave shielding characteristics are improved.

In addition to the above, the base film 7 and the insulating film 9 are both made of engineering plastics. Examples of the engineering plastics include resins such as polypropylene, cross-linked polyethylene, polyester, polybenzimidazole, polyimide, polyimidoamide, polyetherimide, and polyphenylene sulfide (PPS).

The base film 7 and the printed circuit 8 may be joined with each other by adhesive, or may be joined with each other without an adhesive, i.e., in the same manner as a non-adhesive type copper clad laminate. The insulating film 9 may be formed by laminating flexible insulating films 9 by adhesive, or may be formed by performing a series of processes, i.e., application, drying, exposure, development, and thermal treatment of photosensitive insulating resin.

The shield printed wiring board 10 may be manufactured in such a way that, when the adhesive layer 5 of the shield film 1 is formed of thermoplastic resin or thermosetting resin, the shield film 1 is mounted on the flexible printed wiring board 6 and thermal pressing is conducted, so that the shield film 1 is joined with the flexible printed wiring board 6.

When the adhesive layer 5 of the shield film 1 is formed of ultraviolet-curing resin or electron-beam-curing thermosetting resin, the shield film 1 is mounted on the flexible printed wiring board 6 and ultraviolet light or an electron beam is emitted from the transfer film 2 side. Because the pin holes 4a are formed in the metal thin film 4, the ultraviolet light or the electron beam passes through the metal thin film 4 and reach the ultraviolet-curing resin or the electron-beam-curing resin. With this, the ultraviolet-curing resin or the electron-beam-curing resin is cured and the shield film 1 is joined with the flexible printed wiring board 6.

In a solder reflow process for mounting a component on the shield printed wiring board 10 or in the above-described thermal pressing process, when the shield printed wiring board 10 is heated, gas is generated from the adhesive layer 5 and the insulating film 9 and water vapor is generated if the base film 7 has absorbed moisture. However, in the present embodiment, the pin holes 4a are formed in the metal thin film 4, and the water vapor permeability of the shield film 1 according to JISK7129 is 0.5 g/m$^2$ per 24 hours or higher at a temperature of 80 degrees centigrade, a moisture of 95% RH, and a differential pressure of 1 atm, the volatile components described above pass through the metal thin film 4 and are discharged to the outside, and hence delamination due to the volatile components accumulating between the metal thin film 4 and the adhesive layer 5 is prevented.

In the present embodiment, because the particle diameter of the copper oxide (granular material) 12 is in a range of 0.1 to 100 μm, the diameter of each pin hole 4a formed by etching may be in a range of 0.1 to 100 μm. As the diameter of each pin hole 4a is configured to be 0.1 μm or longer, the volatile components generated from the adhesive layer 5 or the like are allowed to escape to the outside through the pin holes 4a of the metal thin film 4. Furthermore, as the diameter of each pin hole 4a is configured to be 100 μm or shorter, the metal thin film 4 is less likely to be broken and is easily handled, and the electromagnetic wave shield film 1 exhibits good electromagnetic wave shielding characteristics with respect to low frequency electromagnetic waves. In view of the handling, diameter of each pin hole is preferably 50 μm or shorter, and more preferably 10 μm or shorter.

In addition to the above, in the present embodiment, because the thickness of the rolled copper foil (metal sheet) 11 before etching is configured to be 1.0 μm or thicker, the electromagnetic wave shield film 1 exhibits good electromagnetic wave shielding characteristics.

Furthermore, as the thickness of the rolled copper foil 11 before etching is configured to be 100 μm or thinner, the time required to dissolve the copper oxide 12 to form the pin holes 4a is shortened when the rolled copper foil 11 is immersed in the etching solution.

In view of the reduction of the time required for dissolving the copper oxide 12 to form the pin holes 4a, the thickness of the rolled copper foil 11 before etching is preferably 50 μm or thinner, and more preferably 10 μm or thinner.

In addition to the above, because in the present embodiment the number of the pin holes 4a in the metal thin film 4 per 1 cm$^2$ is configured to be 10/cm$^2$ or more, delamination due to the volatile components which are generated from the adhesive or the like and accumulate between the metal thin film 4 and the adhesive layer 5 of the electromagnetic wave shield film 1 is further certainly prevented. In addition to the above, because the number of the pin holes 4a in the metal thin film 4 per 1 cm$^2$ is configured to be 1000/cm$^2$ or less, the metal thin film 4 after the etching is less likely to be broken, and the handling of the metal thin film 4 is improved.

In addition to the above, because in the present embodiment the thickness of the metal thin film 4 after the etching is configured to be 0.5 μm or thicker, the metal thin film 4 is less likely to be broken and easily handled, and the electromagnetic wave shield film 1 exhibits good electromagnetic wave shielding characteristics. Furthermore, because the thickness of the metal thin film 4 after the etching is configured to be 12 μm or thinner, the flexibility of the electromagnetic wave shield film 1 is good.

In the present embodiment, the copper oxide 12 in the rolled copper foil 11 before the etching is equivalent to a granular material in an easily-dissolved component of a metal sheet of the present invention, and the pure copper or copper alloy in the rolled copper foil 11 is equivalent to a hard-to-dissolve component of the metal sheet of the present invention. The materials of the metal sheet forming the metal thin film of the present invention, however, are not limited to them.

For example, in a configuration of metal thin film made of copper or copper alloy, the metal thin film having pin holes and made of copper or copper alloy may be manufactured by etching a metal sheet where a granular material formed of a component is dispersed through a predetermined solvent. The component is more soluble in the predetermined solvent than the metal thin film. In this modification, the thickness of the metal thin film (metal sheet) before the etching, the granular diameter of the granular material, the thickness of the metal thin film after the etching, and preferred ranges of the diameter of each pin hole and the density are identical with those in the embodiment above. Furthermore, in view of the reduction of the time required for dissolving the granular material and forming the openings, the metal sheet before the etching is preferably twice as thick as the granular material at the maximum, and more preferably 1.5 times as thick as the granular material at the maximum.

In addition to the above, for example, in a configuration of metal thin film formed of aluminum, silver, or gold or formed of alloy which is mainly made of one of these metals, the metal thin film having pin holes and formed of aluminum, silver, or gold or formed of alloy mainly made of one of these metals may be manufactured by etching a metal sheet where a granular material formed of a component is dispersed through a predetermined solvent. The component is more soluble in the predetermined solvent than the metal thin film. A non-limiting example of the component of the granular material is a component which is easily soluble in an etching solution used in typical etching. In this modification, the thickness of the metal thin film (metal sheet) before the etching, the granular diameter of the granular material, the thickness of the metal thin film after the etching, and preferred ranges of the diameter of each pin hole and the density of the pin holes are identical with those in the embodiment above. Furthermore, in view of the reduction of the time required for dissolving the granular material and forming the openings, the metal sheet before the etching is preferably twice as thick as the granular material at the maximum, and more preferably 1.5 times as thick as the granular material at the maximum.

While the flexible printed wiring board 6 of the present embodiment is a single-sided FPC which has a printed circuit 8 on only one surface of the base film 7, the flexible printed wiring board 6 may be a double-sided FPC in which printed circuits 8 are provided on both surfaces of the base film 7 or a multilayer FPC in which the FPCs are laminated to form plural layers. Furthermore, while in the present embodiment the shield film 1 is provided on only one surface of the flexible printed wiring board 6, the shield films 1 may be provided on both surfaces of the flexible printed wiring board 6 to shield these surfaces.

Second Embodiment

Now, an electromagnetic wave shield film of Second Embodiment will be described. Components having the same configuration as those in First Embodiment will be given the same reference numerals, and the description thereof will be omitted, if appropriate.

A shield film of the present embodiment is identical with the shield film 1 of the First Embodiment except that a metal thin film 104 is different from the metal thin film 4 of the shield film 1 of First Embodiment. The water vapor permeability of the shield film of the present embodiment according to JISK7129 is identical with that in First Embodiment, i.e., 0.5 g/m$^2$ per 24 hours or higher at a temperature of 80 degrees centigrade, a moisture of 95% RH, and a differential pressure of 1 atm.

Figure 4A:
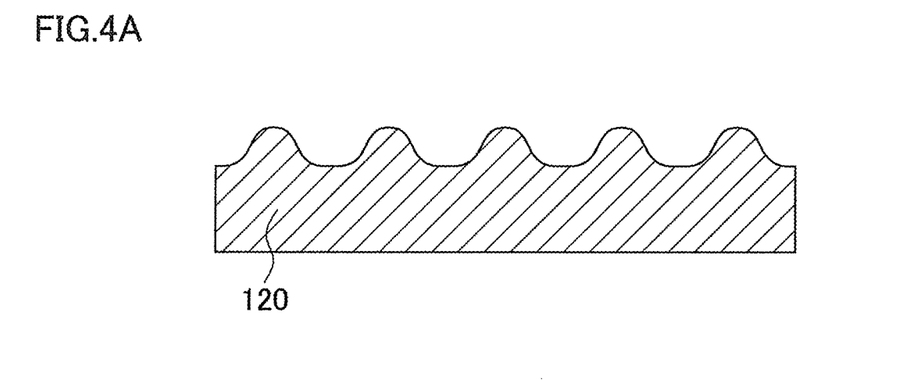
FIG. 4A is an end view for explaining a process of manufacturing a metal thin film of Second Embodiment and Third Embodiment.
Figure 4B:
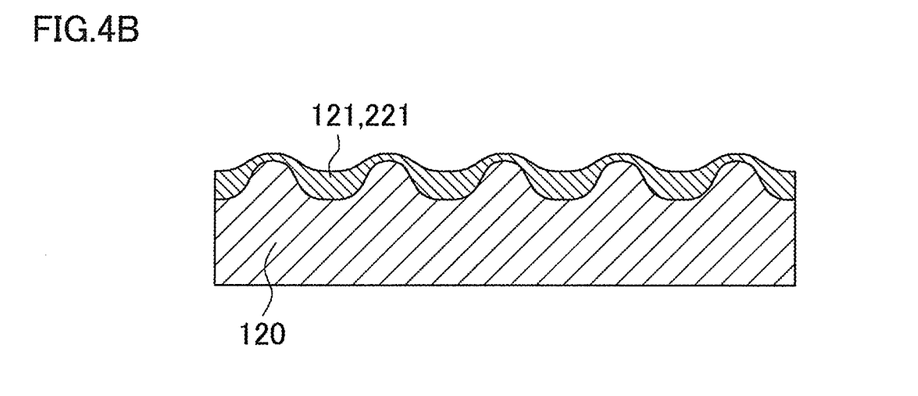
FIG. 4B is an end view for explaining a process of manufacturing a metal thin film of Second Embodiment and Third Embodiment.
Figure 4C:
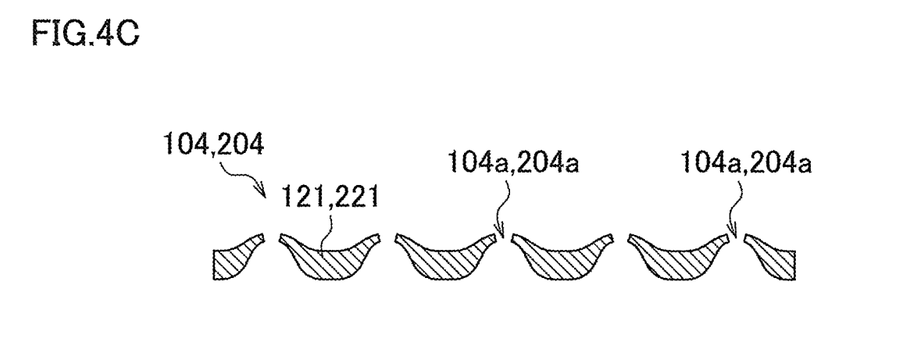
FIG. 4C is an end view for explaining a process of manufacturing a metal thin film of Second Embodiment and Third Embodiment.

The metal thin film 104 is formed of copper and has plural pin holes 104a as shown in FIG. 4C. The thickness (maximum thickness) of the metal thin film 104, the diameter of each pin hole 104a, and the density of the pin holes 104a are identical with those in the metal thin film 4 of First Embodiment. It is noted that, because FIG. 4 is used also in Third Embodiment below, the reference numerals 204, 204a, and 221 in FIG. 4 are provided for Third Embodiment.

The metal thin film 104 of the present embodiment is manufactured in such a way that, to begin with, as shown in FIG. 4A, a carrier copper foil 120 having a roughened surface and including a release layer (not illustrated) thereon is prepared. The surface roughness Ra of the surface of the carrier copper foil 120 is, for example, 1.0 µm or higher and 10 µm or lower. (This Ra is defined in JIS B 0601-1994). The release layer is formed on the surface of the carrier copper foil by a known method, e.g., a carrier copper foil is immersed in a chromium trioxide aqueous solution so that the surface of the carrier copper foil is chromated.

Subsequently, this carrier copper foil 120 is immersed in a sulfuric acid/sulfuric acid copper bath liquid so that, as shown in FIG. 4B, an electro-deposited copper foil 121 is formed on the release layer of the carrier copper foil 120 on account of electrolytic plating. Because the surface of the carrier copper foil 120 is minutely uneven, the thickness of the electro-deposited copper foil 121 is also uneven. When the electro-deposited copper foil 121 becomes as thick as the metal thin film 4 to be manufactured, the electrolysis is terminated, and as shown in FIG. 4C, the electro-deposited copper foil 121 is peeled off from the release layer on the carrier copper foil 120. In combination with the minute unevenness on the surface of the carrier copper foil 120, the thickness of the copper foil 121 formed by the electrolytic plating is significantly uneven. On this account, the electro-deposited copper foil 121 is broken at thin parts (concave parts) at the time of the peeling, with the result that pin holes 104a are formed.

In the present embodiment, because the pin holes 104a are formed in the metal thin film 104, volatile components generated from the adhesive layer 5 or the like when the shield flexible printed wiring board is heated are able to pass through the metal thin film 104 in the same manner as in First Embodiment, and hence delamination due to the volatile components accumulating between the metal thin film 104 and the adhesive layer 5 is prevented.

While in the present embodiment the metal thin film 104 is made of copper, a metal thin film may be formed of metal other than copper (e.g., alloy mainly made of copper, or aluminum, silver, gold, or alloy mainly made of them), by the same manufacturing method as the metal thin film 104 of the present embodiment.

Third Embodiment

Now, an electromagnetic wave shield film of Third Embodiment will be described. Components having the same configuration as those in First Embodiment will be given the same reference numerals, and the description thereof will be omitted, if appropriate.

A shield film of the present embodiment is different from the shield film of Second Embodiment in the method of manufacturing a metal thin film 204. The material and thickness of the metal thin film 204 are identical with those in the shield film of Second Embodiment. The water vapor permeability of the shield film of the present embodiment according to JISK7129 is identical with that in First Embodiment, i.e., 0.5 g/m$^2$ per 24 hours or higher at a temperature of 80 degrees centigrade, a moisture of 95% RH, and a differential pressure of 1 atm.

The metal thin film 204 of the present embodiment is manufactured in such a way that, to begin with, as shown in FIG. 4A, a carrier copper foil 120 having a roughened surface and including a release layer (not illustrated) thereon is prepared in the same manner as in Second Embodiment.

Subsequently, a copper foil 221 is formed on the release layer of the carrier copper foil 120 by vacuum deposition, ion plating, sputtering, CVD, MO (Metal Organic), or the like, which are additive methods. To obtain the vapor-deposited copper foil 221 by vacuum deposition, to begin with, the carrier copper foil 120 with the release layer is set in a vacuum deposition device (not illustrated), and the vapor-deposited copper foil 221 is formed on the release layer of the carrier copper foil 120 by vacuum deposition as shown in FIG. 4B. The vacuum deposition is terminated when the vapor-deposited copper foil 221 becomes substantially as thick as the metal thin film 4 to be formed, and the vapor-deposited copper foil 221 is peeled off from the release layer of the carrier copper foil 120 as shown in FIG. 4C. In combination with the minute unevenness on the surface of the carrier copper foil 120, the thickness of the copper foil 221 formed by the vacuum deposition is significantly uneven. On this account, the vapor-deposited copper foil 221 is broken at thin parts (concave parts) at the time of the peeling, with the result that pin holes 204a are formed. The diameter of each pin hole 204a generated by the peeling and the density of these pin holes 204a are identical with those of the pin holes 104a of Second Embodiment.

In addition to the above, because in the vacuum deposition the kinetic energy of a vacuum deposition material heading toward a base on which the deposition is performed is typically lower than in other additive methods, it is difficult to obtain a fine film. On this account, in the copper foil 221 formed by the vacuum deposition, pin holes (not illustrated; see pin holes 404a in FIG. 6) are formed differently from the pin holes 104a formed by the peeling. Because the vacuum deposition is a method with which such pin holes are particularly easily formed among the additive methods above, the metal thin film 204 is preferably formed by the vacuum deposition.

According to the present embodiment, because the pin holes 204a are formed in the metal thin film 204, volatile components generated from the adhesive layer 5 or the like when the shield flexible printed wiring board is heated are able to pass through the metal thin film 204 in the same manner as in First Embodiment, and hence delamination due to the volatile components accumulating between the metal thin film 204 and the adhesive layer 5 is prevented.

While in the present embodiment the metal thin film 204 is made of copper, a metal thin film may be formed of metal which is not copper (e.g., alloy mainly made of copper, aluminum, silver, gold, or alloy mainly made of them), by the same manufacturing method as the metal thin film 104 of the present embodiment.

Fourth Embodiment

Now, an electromagnetic wave shield film of Fourth Embodiment will be described. Components having the same configuration as those in First Embodiment will be given the same reference numerals, and the description thereof will be omitted, if appropriate.

A shield film of the present embodiment is different from the shield film of First Embodiment in the method of manufacturing a metal thin film 304. The configurations (material, thickness, diameter of each pin hole 304a, and density of pin holes 304a) of the metal thin film 304 are identical with those of the shield film of Second Embodiment.

Figure 5A:
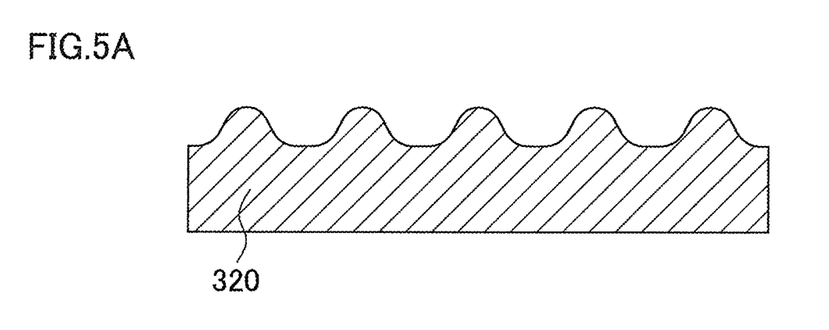
FIG. 5A is an end view for explaining a process of manufacturing a metal thin film of Fourth Embodiment.
Figure 5B:
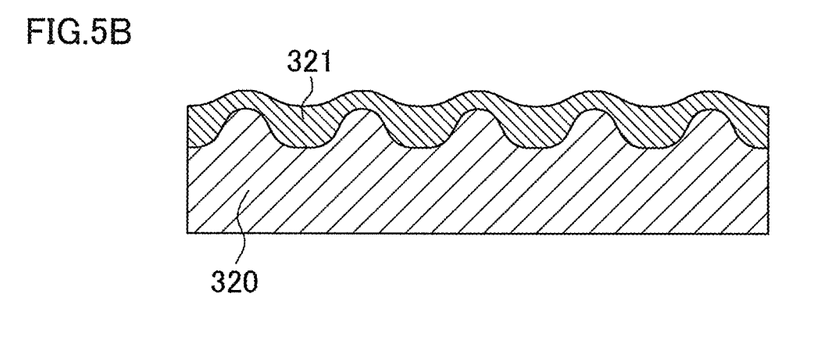
FIG. 5B is an end view for explaining a process of manufacturing a metal thin film of Fourth Embodiment.
Figure 5C:
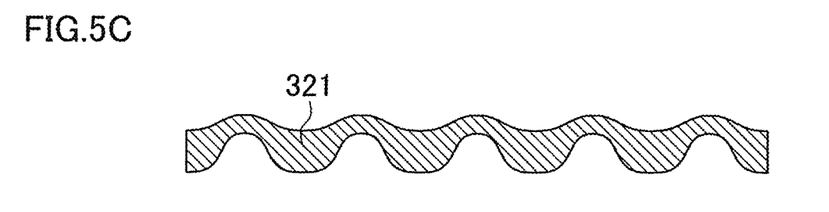
FIG. 5C is an end view for explaining a process of manufacturing a metal thin film of Fourth Embodiment.

The metal thin film 304 of the present embodiment is manufactured in such a way that, to begin with, as shown in FIG. 5A and FIG. 5B, by using a carrier copper foil 320 having a roughened surface and including release layer (not illustrated) thereon in the same manner as in Second Embodiment, an electro-deposited copper foil 321 is formed by electrolytic plating. The electrolysis is terminated when the thickness of the electro-deposited copper foil 321 reaches predetermined thickness which is thicker than the thickness of the metal thin film 304 to be formed, and as shown in FIG. 5C, the electro-deposited copper foil 321 is peeled off from the release layer on the carrier copper foil 320. In the present embodiment, because the electro-deposited copper foil 321 is thicker than the electro-deposited copper foil 121 of Second Embodiment, thin parts (concave parts) of the electro-deposited copper foil 321 are rarely broken by the peeling. The thin parts may be broken.

Figure 5D:
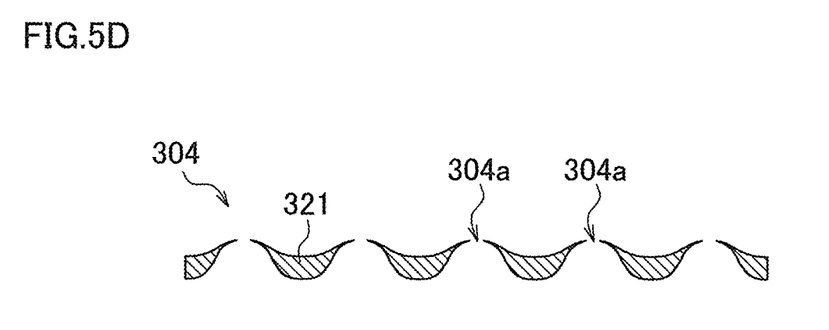
FIG. 5D is an end view for explaining a process of manufacturing a metal thin film of Fourth Embodiment.

Subsequently, as shown in FIG. 5D, the electro-deposited copper foil 321 is immersed in an etching solution which is a sodium persulfate aqueous solution, a mixed solution of hydrogen peroxide and sulfuric acid, or the like. Because the overall thickness of the electro-deposited copper foil 321 is reduced by the immersion, the thin parts at the time of the peeling are dissolved and form through-holes, with the result that pin holes 304a are formed.

According to the present embodiment, because the pin holes 304a are formed in the metal thin film 304, volatile components generated from the adhesive layer 5 or the like when the shield flexible printed wiring board is heated are able to pass through the metal thin film 304 in the same manner as in First and Second Embodiments, and hence delamination due to the volatile components accumulating between the metal thin film 304 and the adhesive layer 5 is prevented.

While in the present embodiment the metal thin film 304 is made of copper, a metal thin film may be formed of metal which is not copper (e.g., alloy mainly made of copper, aluminum, silver, gold, or alloy mainly made of them), by the same manufacturing method as the metal thin film 304 of the present embodiment.

Fifth Embodiment

Now, an electromagnetic wave shield film of Fifth Embodiment will be described. Components having the same configuration as those in First Embodiment will be given the same reference numerals, and the description thereof will be omitted, if appropriate.

A metal thin film 404 of a shield film of the present embodiment is made of silver. The thickness of the metal thin film 404 is preferably in a range of 0.1 to 12 μm, for example. As shown in FIG. 6B, plural pin holes 404a are formed in the metal thin film 404. The water vapor permeability of the shield film of the present embodiment according to JISK7129 is identical with the that in First Embodiment, i.e., 0.5 g/m$^2$ per 24 hours or higher at a temperature of 80 degrees centigrade, a moisture of 95% RH, and a differential pressure of 1 atm.

Figure 6A:
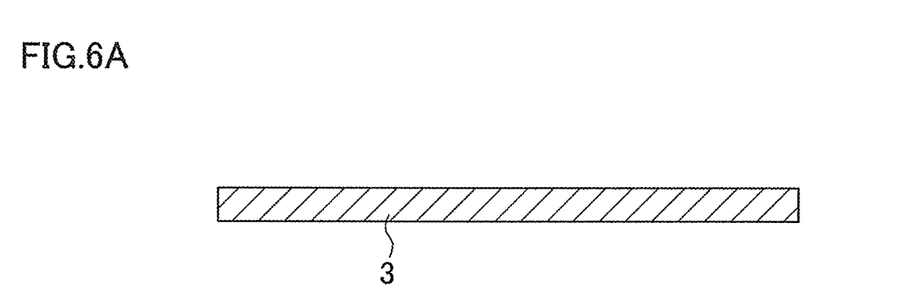
FIG. 6A is an end view for explaining a process of manufacturing a metal thin film of Fifth Embodiment.
Figure 6B:
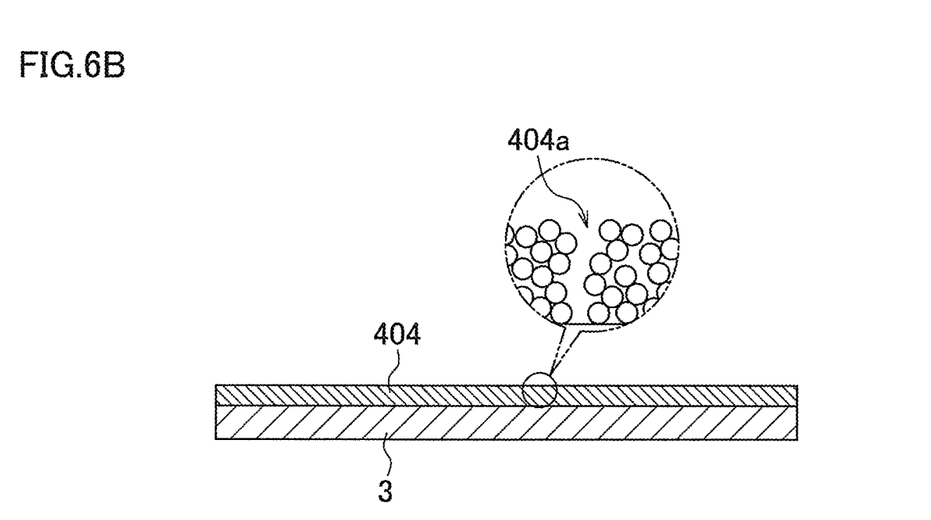
FIG. 6B is an end view for explaining a process of manufacturing a metal thin film of Fifth Embodiment.

The metal thin film 404 of the present embodiment is manufactured in such a way that, to begin with, as shown in FIG. 6A, an insulating layer 3 is prepared to mount the metal thin film 404 thereon. Note that the insulating layer 3 may be, for example, a cover film made of insulating resin, in consideration of the handling when the insulating layer 3 is set in a later-described vacuum deposition device.

Subsequently, a silver foil 404 is formed on the surface of the insulating layer 3 as shown in FIG. 6B by vacuum deposition, ion plating, sputtering, CVD, MO (Metal Organic), or the like, which are additive methods. As the silver foil 404 is formed by one of these additive methods, pin holes 404a are formed in the silver foil 404 due to the reason described in Third Embodiment. Because the pin holes 404a are particularly easily formed by the vacuum deposition, the vacuum deposition is preferable among the additive methods above. To obtain the vapor-deposited silver foil 404 by the vacuum deposition, to begin with, the insulating layer 3 is set in a vacuum deposition device (not illustrated), and the vapor-deposited silver foil 404 is formed on the surface of the insulating layer 3 by the vacuum deposition. The vacuum deposition is terminated when the thickness of the electro-deposited silver foil 404 reaches predetermined thickness.

According to the present embodiment, because the pin holes 404a are formed in the metal thin film 404, volatile components generated from the adhesive layer 5 or the like when the shield flexible printed wiring board is heated are able to pass through the metal thin film 404 in the same manner as in First and Second Embodiments, and hence delamination due to the volatile components accumulating between the metal thin film 404 and the adhesive layer 5 is prevented.

While in the present embodiment the metal thin film 404 is made of silver, a metal thin film may be formed of metal which is not silver (e.g., alloy mainly made of silver, aluminum, copper, gold, or alloy mainly made of them), by the same manufacturing method as the metal thin film 404 of the present embodiment.

EXAMPLES

Example 1

Figure 7A:
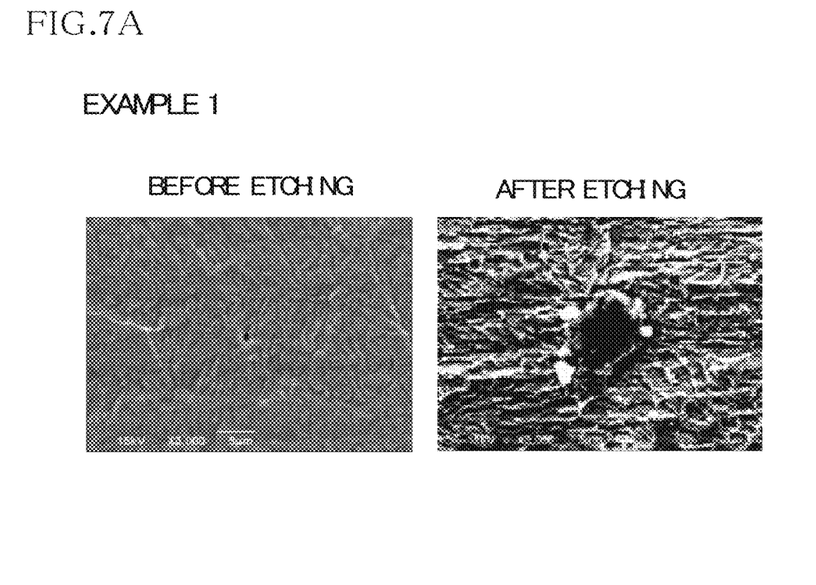
FIG. 7A shows photos before and after the etching of a rolled copper foil of Example 1.

A 6 μm thick rolled copper foil (made by JX Nippon Mining & Metals Corp.) made of tough-pitch copper was thinned to be 2 μm by etching in manner similar to that in the metal thin film of First Embodiment, and then a shield film identical with the shield film shown in FIG. 1 was manufactured by the rolled copper foil. The etching solution was a solution formed by adding, to 25.0 g/L of $CuSO_4 \cdot 5H_2O$, 8.5 volume % of concentrated sulfuric acid (98%) and 4.5 volume % of hydrogen peroxide (35%). In this etching solution, the rolled copper foil was immersed for two minutes. FIG. 7A shows photos before and after the etching of the rolled copper foil in Example 1. As shown in FIG. 7A, in the rolled copper foil after the etching, pin holes each being about 5 μm in diameter were formed.

Example 2

Figure 7B:
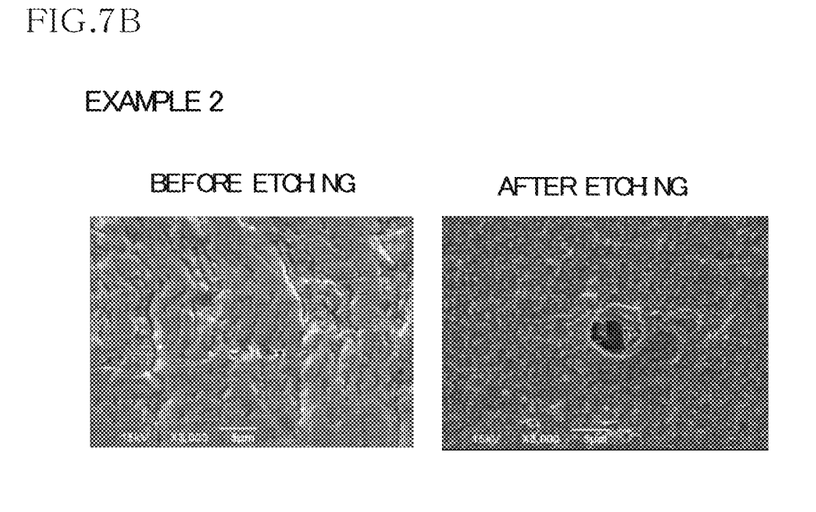
FIG. 7B shows photos before and after the etching of a rolled copper foil of Example 2.

A 9 μm HA foil (product name) which was a rolled copper foil (made by JX Nippon Mining & Metals Corp.) was thinned to be 2 μm by etching in a manner similar to that in the metal thin film of First Embodiment, and then a shield film identical with the shield film shown in FIG. 1 was manufactured by this rolled copper foil. FIG. 7B shows photos before and after the etching of the rolled copper foil in Example 2. As shown in FIG. 7B, in the rolled copper foil after the etching, pin holes each being about 5 μm in diameter were formed.

Example 3

A 1 μm thick electro-deposited copper foil was formed by a method similar to the method of forming the metal thin film of Second Embodiment, and a shield film with similar configuration to that in FIG. 1 was manufactured by using this electro-deposited copper foil. The surface roughness (Ra) of the surface of a carrier copper foil was 4.0 μm, and a release layer was formed on the surface of the carrier copper foil by immersing the carrier copper foil in the chromium trioxide aqueous solution so that the surface was chromated.

Example 4

A 2 μm thick electro-deposited copper foil was formed by the method of forming the metal thin film of Second Embodiment, and a shield film with similar configuration to that in FIG. 1 was manufactured by using this electro-deposited copper foil. The surface roughness of the surface of the carrier copper foil was identical with the surface roughness in Example 3.

Example 5

By the method of manufacturing the metal thin film in Fifth Embodiment, a 0.1 μm thick vapor-deposited silver foil was formed on a cover film made of insulating resin, and a shield film with similar configuration to that in FIG. 1 was manufactured by using this laminated body of the insulating film and silver foil.

Comparative Example 1

A 5 μm thick electro-deposited copper foil was formed by the method of forming the metal thin film of Second Embodiment, and a shield film with similar configuration to that in FIG. 1 was manufactured by using this electro-deposited copper foil. The surface roughness of the surface of the carrier copper foil was identical with the surface roughness in Example 3.

Comparative Example 2

A shield film 5 μm thick to that in FIG. 1 was manufactured by using a rolled copper foil which was 6 μm in thickness and was made of tough-pitch copper.

TABLE 1

| | METAL THIN FILM | | THICKNESS μm | WATER VAPOR PERMEABILITY $g/m^2 \cdot 24\ h$ | INTERLAYER EXFOLIATION AFTER REFLOW |
|---|---|---|---|---|---|
| EXAMPLE1 | ROLLED COPPER FOIL | TOUGH-PITCH COPPER | 2 | 13.4 | GOOD |
| EXAMPLE2 | ROLLED COPPER FOIL | COPPER + SILVER ALLOY | 2 | 0.547 | SATISFACTORY |
| EXAMPLE3 | ELECTRO-DEPOSITED COPPER FOIL | COPPER | 1 | 1110 | GOOD |
| EXAMPLE4 | ELECTRO-DEPOSITED COPPER FOIL | COPPER | 2 | 0.58 | SATISFACTORY |
| EXAMPLE5 | VAPOR-DEPOSITED COPPER FOIL | SILVER | 0.1 | 9050 | GOOD |
| COMPARATIVE EXAMPLE1 | ELECTRO-DEPOSITED COPPER FOIL | COPPER | 5 | 0 | BAD |
| COMPARATIVE EXAMPLE2 | ROLLED COPPER FOIL | TOUGH-PITCH COPPER | 6 | 0 | BAD |

(Measurement of Water Vapor Permeability)

The water vapor permeabilities of the shield films of Examples 1 to 5 and Comparative Examples 1 and 2 were measured by a differential-pressure method (conforming to JISK7129), respectively. Measurement conditions were 80 degrees centigrade in temperature, 95% RH in moisture, and 1 atm in differential pressure.

(Evaluation of Occurrence of Delamination)

Each of the shield films of Examples 1 to 5 and Comparative Examples 1 and 2 was joined with a printed wiring board by thermal pressing. Subsequently, after the printed wiring board was left for seven days in a clean room which was 23 degrees centigrade in temperature and 63% RH in moisture, whether delamination occurred was evaluated while the printed wiring board was exposed to a temperature condition in reflowing. The temperature condition in reflowing was set at a temperature profile of 265 degrees centigrade at the maximum, and in consideration of lead-free solder. Furthermore, whether delamination occurred was evaluated in such a way that the printed wiring board with which the shield film was joined was caused to pass an infrared reflow furnace five times, and the existence of swelling was visually checked. The evaluation result was GOOD when no swelling occurred in the shield film at all, was SATISFACTORY when only a part of the shield film swelled, or was BAD when the entire surface of the shield film significantly swelled. The results are shown in Table 1.

As clearly shown in Table 1, while the water vapor permeabilities were zero in Comparative Examples 1 and 2, the water vapor permeabilities were 0.5 g/m$^2$ per 24 hours or higher in Examples 1 to 5. The water vapor permeability in Example 1 was higher than that in Example 2. This was presumably because the density (number of molecules/cm$^2$) of copper oxide in the rolled copper foil before the etching in Example 1 was higher than the density in Example 2. Furthermore, the water vapor permeability of Example 3 was significantly higher than that in Example 4. This was presumably because, as the electro-deposited copper foil of Example 3 was thin, peeling occurred not only at relatively thin parts (concave parts) of the electro-deposited copper foil but also partially at relatively thick parts, when the electro-deposited copper foil was peeled off from the carrier copper foil. No swelling occurred at all even after passing the infrared reflow furnace in Examples 1, 3, and 5. In Examples 2 and 4, swelling occurred only at a part of the shield film even after passing the infrared reflow furnace. In the meanwhile, in Comparative Examples 1 and 2, the entire surface of the shield film significantly swelled after passing the infrared reflow furnace.

REFERENCE SIGNS LIST

1 ELECTROMAGNETIC WAVE SHIELD FILM
2 TRANSFER FILM
3 INSULATING LAYER
4 METAL THIN FILM
4a PIN HOLE (OPENING)
5 ADHESIVE LAYER
6 FLEXIBLE PRINTED WIRING BOARD (PRINTED WIRING BOARD)
10 SHIELD PRINTED WIRING BOARD
11 ROLLED COPPER FOIL (METAL SHEET)
12 COPPER OXIDE
104, 204, 304, 404 METAL THIN FILM
121, 321 ELECTRO-DEPOSITED COPPER FOIL
221 VAPOR-DEPOSITED COPPER FOIL
104a, 204a, 304a, 404a PIN HOLE

We claim:

1. A method for manufacturing an electromagnetic wave shield film comprising at least a metal thin film and an adhesive layer, the metal thin film and the adhesive later being laminated in order, wherein, water vapor permeability according to JISK7129 is 0.5 g/m$^2$ or higher per 24 hours at a temperature of 80 degrees centigrade, a moisture of 95% RH, and a differential pressure of 1 atm, the method comprising:

a step of preparing a carrier copper foil having a roughened surface with a release layer formed thereon, the roughened surface having a roughness Ra of 4 μm to 10 μm;

a step of forming an electro-deposited copper foil on the release layer, the electro-deposited copper foil having thick parts and thin parts attributable to the roughened surface of the carrier copper foil;

a step of making the metal thin film by peeling the electro-deposited copper foil from the release layer such that pin holes are formed in sufficient area density to yield vapor permeability of 0.5 g/m$^2$ or higher per 24 hours as the thin parts of the electro-deposited copper foil break; and then a step of laminating the adhesive layer on the metal thin film;

wherein the area density of the pin holes is 10 to 1000 holes/cm$^2$; and wherein the pin holes have diameters of 0.1 to 100 μm.

2. The method for manufacturing an electromagnetic wave shield film according to claim 1, wherein the electro-deposited copper foil has a thickness of 0.5 to 12 μm.

* * * * *